United States Patent [19]

Westbrook

[11] Patent Number: 5,184,210
[45] Date of Patent: Feb. 2, 1993

[54] STRUCTURE FOR CONTROLLING IMPEDANCE AND CROSS-TALK IN A PRINTED CIRCUIT SUBSTRATE

[75] Inventor: Scott R. Westbrook, Los Altos, Calif.

[73] Assignee: Digital Equipment Corporation, Maynard, Mass.

[21] Appl. No.: 668,387

[22] Filed: Mar. 13, 1991

Related U.S. Application Data

[63] Continuation of Ser. No. 496,811, Mar. 20, 1990, abandoned.

[51] Int. Cl.[5] .................. H01L 23/12; H01P 3/08; H03K 17/80
[52] U.S. Cl. .................. 257/664; 333/238; 307/408; 307/409; 174/253
[58] Field of Search .......... 357/81, 74, 70, 71, 357/72; 307/408, 409, 422, 423; 361/388, 389; 333/238

[56] References Cited

U.S. PATENT DOCUMENTS

| | | | |
|---|---|---|---|
| 4,441,088 | 4/1984 | Anderson | 333/1 |
| 4,490,690 | 12/1984 | Suzuki | 333/1 |
| 4,551,746 | 11/1985 | Gilbert et al. | 357/74 |
| 4,560,962 | 12/1985 | Barrow | 333/1 |
| 4,725,878 | 2/1988 | Miyauchi et al. | 357/71 |
| 4,774,632 | 9/1988 | Neugebauer | 357/81 |
| 4,827,327 | 5/1989 | Miyauchi et al. | 357/71 |
| 4,855,871 | 8/1989 | Young | 357/71 |

Primary Examiner—William D. Larkins
Assistant Examiner—Carl Whitehead, Jr.
Attorney, Agent, or Firm—Arnold, White & Durkee

[57] ABSTRACT

An arrangement for interconnecting high density signals of integrated circuits includes an electronic circuit on a multilayered substrate which includes at least three layers. These layers comprise a signal layer for carrying signals in the electronic circuit, a dielectric layer of organic material disposed adjacent the signal layer, and a metallic reference layer. The layers are disposed such that the dielectric layer is between the signal layer and the metallic reference layer. For providing controlled line impedance and for reducing cross-talk between the signals carried in the electronic circuit, the metallic reference layer includes uniformly spaced apertures which are situated in a slanted grid arrangement.

23 Claims, 2 Drawing Sheets

STRUCTURE FOR CONTROLLING IMPEDANCE AND CROSS-TALK IN A PRINTED CIRCUIT SUBSTRATE

FIELD OF THE INVENTION

The present invention relates generally to electrical signal distribution and, more particularly, to arrangements for interconnecting integrated circuits.

BACKGROUND OF THE INVENTION

Integrated circuits are continually being built and interconnected in denser and more complex packages. These circuits are being used to address high technology electronic applications and often include circuits that are designed to operate at high frequencies and at relatively high power levels. For example, many high performance digital computers are being implemented using VLSI (very large scale integration) ECL (emitter coupled logic) circuits operating at frequencies approaching 400 mega-Hertz and power density levels approaching 30 Watts per square centimeter.

When used in a relatively dense electronic package, this type of circuitry must meet rigidly defined electrical and mechanical specifications. These specifications concern line impedance, continuity, and minimal noise and cross-talk interference. Unfortunately, these design criteria have been met with only limited success in the prior art. For example, prior art structures, which have been designed to interconnect components of high performance digital computers, have included multiple layers consisting of conductors disposed in a polymer matrix. Those prior art structures have dielectric properties that allow high speed pulse propagation, but fail to significantly reduce the cross-talk of high speed signals in a highly dense electronic package.

Other types of prior art structures have been designed to attempt to overcome the cross-talk problem referred to above and to improve the line impedance characteristic throughout the structure. Typically, this includes particularly selected shapes, materials, widths and thicknesses to implement the various planes comprising the structure. These types of prior art structures, however, have been unable to provide adequate high frequency and controlled impedance operation while sufficiently minimizing cross-talk.

These shortcomings are especially prevalent in structures using an organic dielectric material, such as polyimide, adjacent an interconnect or a transmission line. Such a dielectric material requires venting during fabrication of the structure to release moisture in the dielectric material which could cause delamination. Thus, the use of a surface layer covering the dielectric material must be properly vented. Unfortunately, venting is difficult because wherever an interconnect or transmission line crosses a ventilation hole, a discontinuity ensues which increases the impedance and cross-talk between signals carried by the interconnect or transmission line.

SUMMARY OF THE INVENTION

In accordance with a preferred embodiment, the present invention provides a high speed signal carrying arrangement for an electronic circuit which may be used to interconnect multiple integrated circuits with minimal cross-talk and controlled impedance. The arrangement includes an electronic circuit on a multilayered substrate having at least three layers. These layers comprise a signal layer having signal traces for carrying signals in the electronic circuit, a layer of organic dielectric material disposed adjacent the signal layer, and a metallic reference layer. The layers are disposed such that the dielectric layer is between the signal layer and the metallic reference layer. The metallic reference layer includes uniformly spaced apertures therein which are situated in a slanted grid arrangement and spaced so that the signal traces traverse approximately an equal number of apertures; thereby providing controlled line impedance and reducing the cross-talk between the signals carried by the signal traces.

BRIEF DESCRIPTION OF THE DRAWINGS

Other objects and advantages of the present invention will become apparent upon reading the following detailed description and upon reference to the drawings in which.

Figure 1:
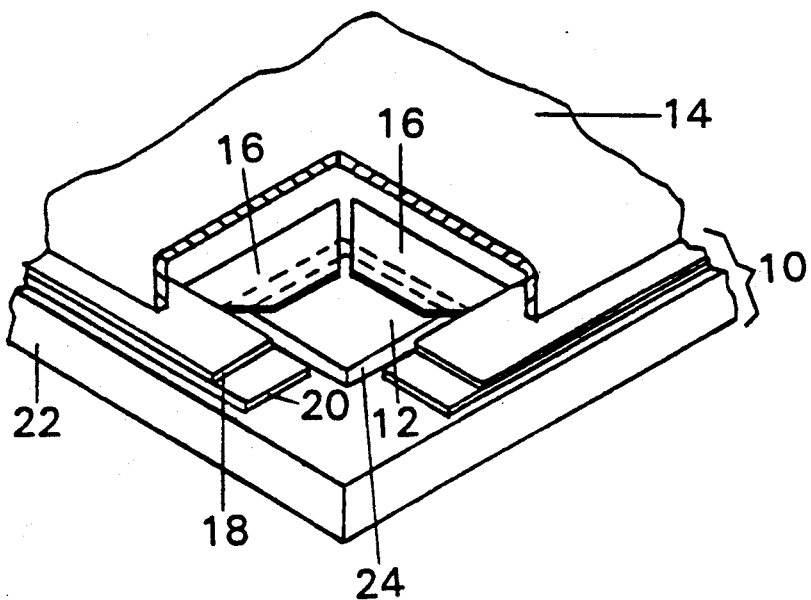
FIG. 1 is a perspective, cut-away view of module, including a high density signal carrier, for supporting and interconnecting a plurality of integrated circuits, according to the present invention.

While the invention is susceptible to various modifications and alternative forms, specific embodiments thereof have been shown by way of example in the drawings and will herein be described in detail. It should be understood, however, that it is not intended to limit the invention to the particular forms disclosed. On the contrary, the intention is to cover all modifications, equivalents, and alternatives falling within the spirit and scope of the invention as defined by the appended claims.

DETAILED DESCRIPTION OF THE PREFERRED EMBODIMENTS

There are a variety of structure types with which the present invention may be used. However, the present invention is particularly advantageous for high speed, high density circuits operating in a multilayered structure comprising conductive signal layers separated by an organic dielectric.

Figure 2:
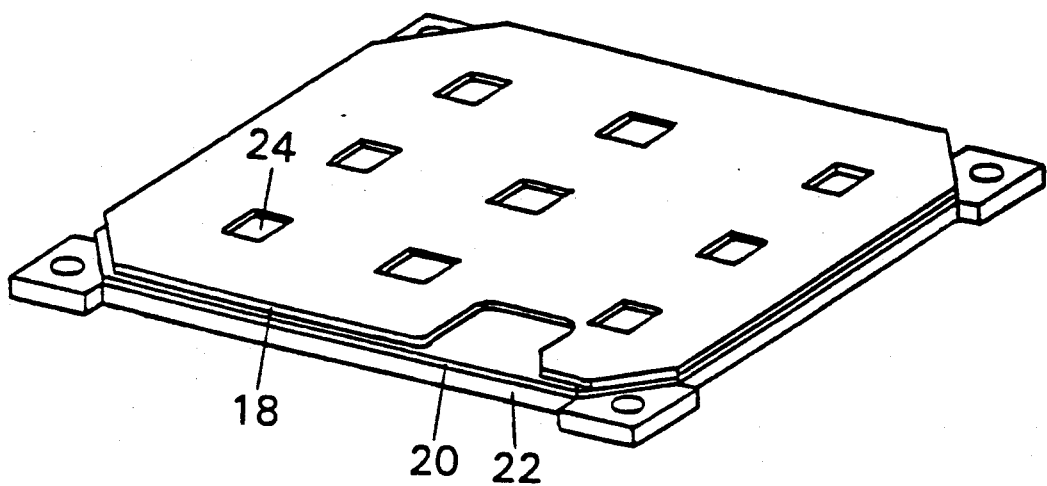
FIG. 2 is a perspective view of the high density signal carrier of FIG. 1, according to the present invention, which may be implemented as part of the module illustrated in FIG. 1.

FIGS. 1 and 2 provide perspective, cut-away views of such a structure, or multi-chip unit (MCU), which incorporates the present invention. The MCU includes a high density signal carrier (HDSC) 10, which is used to intercouple electrical signals to and from leads of certain integrated circuit die 12, and a lid 14, which is used to protect the HDSC 10 from mechanical damage. The leads of the integrated circuit die 12 are electrically coupled to the HDSC 10 using conventional tape automated bonding techniques, the product of which is referred to as a "TAB" 16 of FIG. 1.

The HDSC 10 consists of three distinct sections which are fabricated separately and subsequently integrated. They are a signal core 18, a power core 20, and a thermally conductive baseplate 22 for structural support and dissipation of heat from the die 12 The die 12 are secured to the baseplate 22 through die sites 24 in the other two sections. The signal core 18 and the power core 20 consist of thin layers of copper and dielectric material, preferably polyimide. The outer surfaces of the signal and power cores 18 and 20, surrounding the dielectric material, include metallic reference planes for carrying power and ground. Because the curing of the polyimide causes moisture to be released from the dielectric material, proper venting must be provided through the reference planes. An important object of the present invention is to accommodate this curing requirement without disturbing the line impedance or the isolation between the signals in the signal core.

Figure 3:
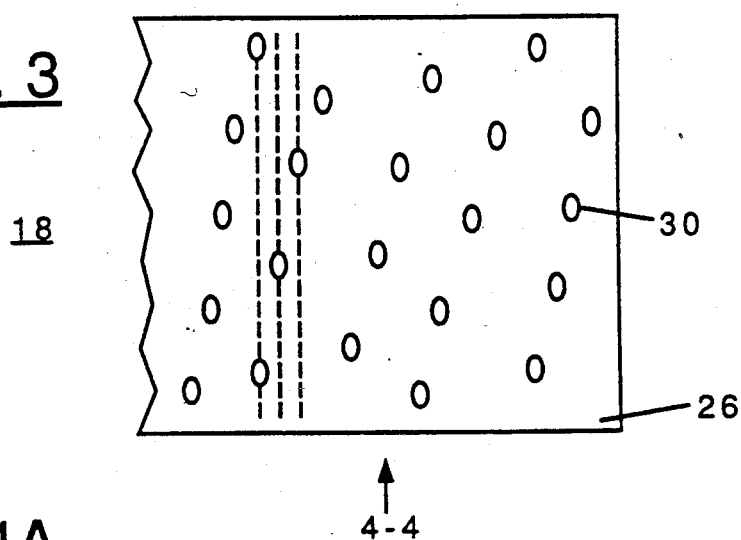
FIG. 3 is a top view of the high density signal carrier of FIG. 1, shown along line 3—3 of FIG. 2.
Figure 4A:
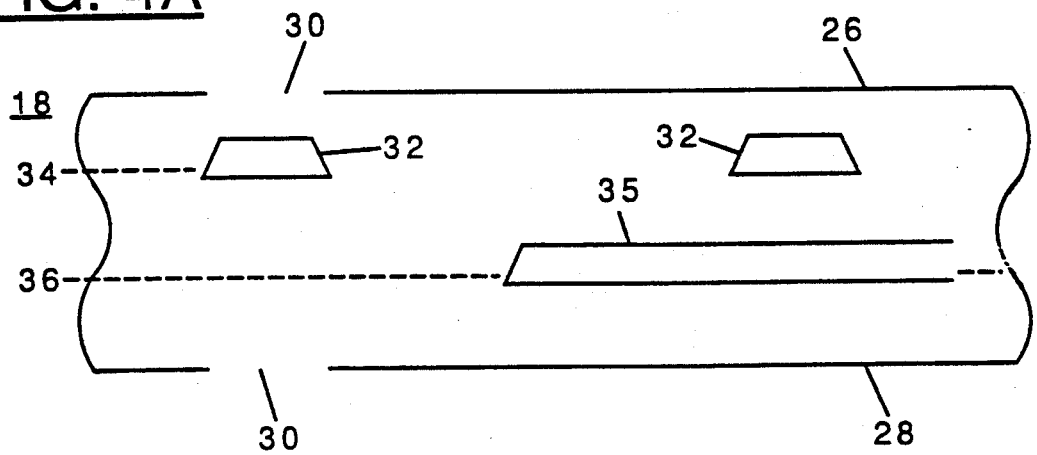
FIG. 4a is an enlarged cross-sectional diagram of the high density signal carrier of FIG. 1, shown along line 4—4 of FIG. 3.

This object is preferably accomplished by perforating the reference planes 26 and 28 which cover the dielectric material in a uniformly spaced, slanted grid pattern, as illustrated from top and cross-sectional views of the signal core 18 in FIGS. 3 and 4a, respectively. In FIG. 3, the perforations or apertures 30 through the reference plane 26 on the top of the signal core are depicted by ovals, and conductive traces 32 are depicted by dashed lines. Although different types of shapes may be used, the apertures 30 preferably have a circle-like shape, e.g., round or octagonally shaped.

In FIG. 4a, the apertures 30 are depicted through reference planes 26 and 28 on the top and bottom surfaces of the signal core, and transversely oriented conductive traces 32 and 35 are shown on two separate signal layers 34 and 36. The conductive traces, in combination with the reference planes 26 and 28, comprise strip-line type transmission lines.

Delamination may be avoided using apertures spaced apart less than 1500 microns; however, to optimally reduce crosstalk, the number of apertures per linear distance of signal path should be minimized. As a preferred compromise between these two opposing ideals, the slanted grid pattern (as illustrated in FIG. 3) includes apertures spaced, on center, on a 500 microns by 100 microns grid, i.e., 500 microns on center in one direction and 100 microns in the other direction; thus, there is one aperture per 2400 microns of signal path. In a preferred embodiment, the apertures 30 are 100 microns in diameter, but may range from 25 to 200 microns. While this grid arrangement is preferred, an acceptable uniform grid includes apertures spaced between 300 and 1500 microns.

This slanted grid pattern allows the conductive traces in the signal layers to cross under, over and/or nearby the same number of apertures. If each trace runs parallel to the others, as illustrated in FIG. 3, the inherent discontinuity caused by each aperture is the same for each conductive trace. Consequently, this arrangement provides controlled line impedance and reduces the crosstalk between the signals carried in the electronic circuit. Moreover, a uniform impedance environment is essential for minimizing undesired signal reflections.

The apertures may be formed using a two-step process. First, a signal cover layer (e.g., metal reference layer) may be sputtered on the vented surface of the polyimide. Next, using a photoresist as a template, the apertures may be chemically etched out of the signal cover layer.

Figure 4B:
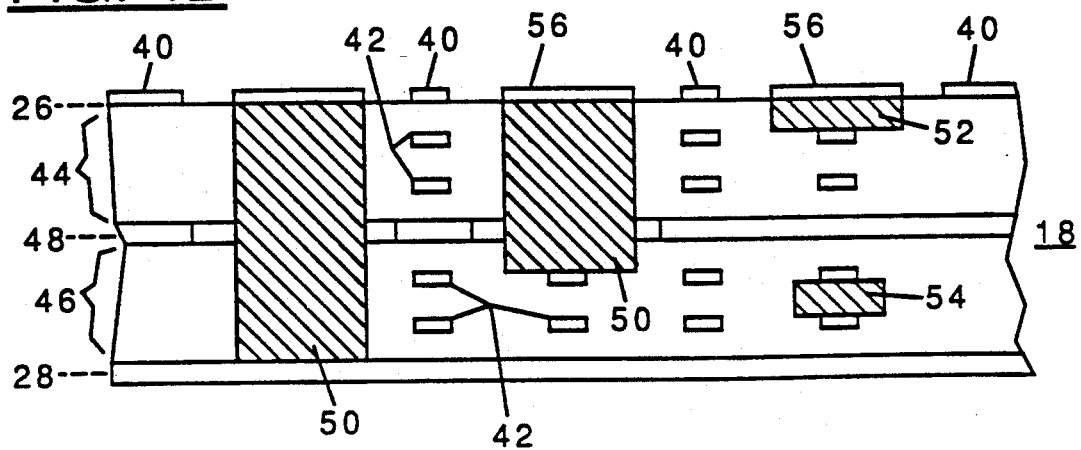
FIG. 4b is another cross-sectional diagram of the high density signal carrier of FIG. 1, showing other aspects of the high density signal carrier along line 4—4 of FIG. 3.

FIG. 4b provides a cross-sectional perspective of the signal core 18 (with insufficient detail to illustrate the perforations). All conductive planes and traces are preferably copper and are used for interfacing to the integrated circuit die. The signal core is shown to include conductive traces 40 as part of reference plane 26, conductive traces 42 as part of dielectric layers 44 and 46, and reference planes 26, 28 and 48. Since the dielectric material is used on either side of the reference plane 48, the perforations are employed as shown in FIGS. 3 and 4a through both outer reference planes 26 and 28.

Drilled and plated through-holes (or vias) 50, 52 and 54 distribute signals and power between top surface pads 56, the signal core 18 and the power core 20.

The power core 20 of FIGS. 1 and 2 similarly includes reference planes separated by dielectric material with apertures through the reference planes. However, because line impedance and crosstalk are not relevant problems in the power core, a slanted grid pattern in the reference planes is not necessary. Thus, any type of venting pattern, for example, a square grid pattern, may be used to provide the necessary venting during the curing process.

For further information regarding the MCU of FIG. 1, reference may be made to MODULE AND TECHNIQUE FOR INTERCONNECTING INTEGRATED CIRCUITS, Marshall et al., U.S. patent application Ser. No. 07/450,219 filed Dec. 13, 1989, assigned to the instant assignee and incorporated herein by reference.

While the invention has been particularly shown and described with reference to various embodiments, it will be recognized by those skilled in the art that modifications and changes may be made to the present invention described above without departing from the spirit and scope thereof.

What is claimed is:

1. A signal carrying arrangement for an electronic circuit, comprising:
    a multilayered substrate having
        a signal layer including signal traces for carrying signals in the electronic circuit,
        a layer of dielectric material disposed adjacent the signal layer, and
        a signal cover layer, disposed such that the dielectric material is between the signal layer and the signal cover layer, including ventilation apertures therein which are spaced so that each of the signal traces traverses approximately an equal number of the apertures to reduce degradation of the signals in the signal traces.

2. A signal carrying arrangement, according to claim 1, wherein the apertures in the signal cover layer are situated in a slanted grid arrangement.

3. A signal carrying arrangement, according to claim 1, wherein the multilayered substrate is primarily comprised of copper conductors and polyimide-type dielectric material.

4. A signal carrying arrangement, according to claim 3, wherein the copper conductors and polyimide alternate so that the polyimide provides insulation to the copper conductors.

5. A signal carrying arrangement, according to claim 1, wherein the multilayered substrate includes copper conductors and polyimide situated to provide at least one strip-line conductor section.

6. A signal carrying arrangement, according to claim 1, wherein the multilayered substrate includes copper conductors and polyimide situated to provide at least one transmission line.

7. A signal carrying arrangement, according to claim 1, wherein the layers of the multilayered substrate are inseparably secured to one another.

8. A signal carrying arrangement, according to claim 1, wherein the signal cover layer is a metallic reference plane and the apertures are situated in a slanted grid arrangement.

9. A high density signal carrying arrangement for an electronic circuit, comprising:
   an electronic circuit having leads for carrying signals; and
   a multilayered substrate having
      a signal layer including signal traces for carrying signals in the electronic circuit,
      a dielectric layer of organic material disposed adjacent the signal layer, and
      a metallic reference layer, disposed such that the dielectric layer is between the signal layer and the metallic reference layer, including uniformly spaced apertures therein which are situated in a slanted grid arrangement for providing controlled line impedance and for reducing crosstalk between the signals carried in the electronic circuit.

10. A high density signal carrying arrangement, according to claim 9, wherein the multi-layered substrate includes separate and adjacent layers for power and ground.

11. A high density signal carrying arrangement, according to claim 9, wherein the apertures are spaced so that the signal traces traverse approximately an equal number of apertures.

12. A high density signal carrying arrangement, according to claim 9, wherein the multilayered substrate further includes a power core having a plurality of conductive power layers and wherein the signal layer, the dielectric layer and the metallic reference layer form a signal core which is secured to the power core.

13. A high density signal carrying arrangement, according to claim 9, wherein the apertures are approximately 100 microns in diameter.

14. A high density signal carrying arrangement, according to claim 9, wherein the grid arrangement is defined by a 500 microns by 100 microns grid.

15. A high density signal carrying arrangement, according to claim 9, wherein the apertures are approximately 100 microns in diameter and wherein the grid arrangement is defined by a 500 microns by 100 microns grid.

16. A high density signal carrying arrangement, according to claim 9, wherein the reference plane is used to form a strip-line transmission path.

17. A high density signal carrying arrangement for an electronic circuit, comprising:
   an electronic circuit having leads for carrying signals; and
   a multilayered substrate having
      a signal layer including a transmission lines for carrying signals in the electronic circuit,
      a dielectric layer of polyimide material disposed adjacent the signal layer, and
      a metallic reference layer, disposed such that the dielectric layer is between the signal layer and the metallic reference layer, including uniformly spaced apertures therein which are situated in a slanted grid arrangement so that each transmission line traverses approximately an equal number of apertures.

18. A high density signal carrying arrangement, according to claim 17, wherein the transmission line is a strip-line.

19. A high density signal carrying arrangement, according to claim 17, wherein the transmission line includes the metallic reference layer as a reference plane.

20. A high density signal carrying arrangement, according to claim 17, wherein the multilayered substrate further includes a power core having a plurality of conductive power layers and wherein the signal layer, the dielectric layer and the metallic reference layer form a signal core which is secured to the power core.

21. A high density signal carrying arrangement, according to claim 17, wherein the apertures have a circle-like shape, with a diameter between 25 and 200 microns, and are separated from one another by distances between 300 and 1500 microns.

22. A signal carrying arrangement for an electronic circuit, comprising:
   a multilayered substrate having
   a signal layer including signal traces for carrying signals in the electronic circuit.
   a layer of dielectric material disposed adjacent the signal layer, and
   a signal cover layer, disposed such that the dielectric material is between the signal layer and the signal cover layer, including ventilation apertures situated in a slanted grid arrangement therein, said apertures being spaced so that each of the signal traces traverses approximately an equal number of the apertures to reduce degradation of the signals in the signal traces.

23. A signal carrying arrangement for an electronic circuit, comprising:
   a multilayered substrate having
   a signal layer including signal traces for carrying signals in the electronic circuit,
   a layer of dielectric material disposed adjacent the signal layer, and
   a signal cover layer, said signal cover layer being a metallic reference plane and being disposed such that the dielectric material is between the signal layer and the signal cover layer, including ventilation apertures situated in a slanted grid arrangement therein, said apertures being spaced so that each of the signal traces traverses approximately an equal number of the apertures to reduce degradation of the signals in the signal traces.

* * * * *